(12) United States Patent
Stinson et al.

(10) Patent No.: US 7,938,982 B2
(45) Date of Patent: May 10, 2011

(54) SILICON WAFER ETCHING COMPOSITIONS

(75) Inventors: Mark G. Stinson, Wood River, IL (US); Henry F. Erk, St. Louis, MO (US); Guoqiang Zhang, Ballwin, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 485 days.

(21) Appl. No.: 11/968,381

(22) Filed: Jan. 2, 2008

(65) Prior Publication Data

US 2008/0099717 A1 May 1, 2008

Related U.S. Application Data

(62) Division of application No. 11/152,362, filed on Jun. 14, 2005, now Pat. No. 7,323,421.

(60) Provisional application No. 60/580,224, filed on Jun. 16, 2004.

(51) Int. Cl.
*C09K 13/08* (2006.01)

(52) U.S. Cl. ........................ 252/79.3; 252/79.4; 252/79.5

(58) Field of Classification Search ................. 252/79.3, 252/79.4, 79.5
See application file for complete search history.

(56) References Cited

U.S. PATENT DOCUMENTS

| | | | |
|---|---|---|---|
| 2,902,419 A | | 9/1959 | Carasso et al. |
| 3,393,091 A | * | 7/1968 | Widmann et al. ............ 438/654 |
| 3,634,217 A | | 1/1972 | Ram et al. |
| 5,302,311 A | | 4/1994 | Sugihara et al. |
| 5,482,566 A | | 1/1996 | Lee |
| 5,498,293 A | | 3/1996 | Ilardi et al. |
| 5,712,168 A | | 1/1998 | Schmidt et al. |
| 6,066,609 A | | 5/2000 | Martin et al. |
| 6,110,839 A | * | 8/2000 | Nakano et al. ................ 438/753 |
| 6,238,592 B1 | | 5/2001 | Hardy et al. |
| 6,383,060 B2 | | 5/2002 | Kawasaki et al. |
| 6,455,906 B2 | | 9/2002 | Chen et al. |
| 6,465,403 B1 | | 10/2002 | Skee |
| 6,481,449 B1 | | 11/2002 | Manchester et al. |
| 6,503,363 B2 | | 1/2003 | Nakano et al. |
| 6,566,158 B2 | | 5/2003 | Eriksen et al. |
| 2001/0003061 A1 | | 6/2001 | Chen et al. |
| 2003/0036247 A1 | | 2/2003 | Eriksen et al. |
| 2003/0168431 A1 | | 9/2003 | Lee et al. |
| 2003/0207778 A1 | | 11/2003 | So et al. |
| 2004/0002430 A1 | | 1/2004 | Verhaverbeke |
| 2004/0142835 A1 | * | 7/2004 | Takashima .................... 510/175 |

(Continued)

FOREIGN PATENT DOCUMENTS

DE 3822350 A1 1/1990

(Continued)

OTHER PUBLICATIONS

Henneke H., Comment on 'Polarity Effects in INSB—Alloyed P-N Juctions', Journal of Applied Physics, Sep. 9, 1965, pp. 2967-2968, vol. 36, No. 9, American Institute of Physics, New York, NY.

(Continued)

*Primary Examiner* — Binh X Tran
(74) *Attorney, Agent, or Firm* — Armstrong Teasdale LLP

(57) ABSTRACT

A process for etching silicon wafers using a caustic etchant in the form of an aqueous solution comprising water, a hydroxide ion source, and a chelating agent. The process produces silicon wafers substantially free from diffused metal ions.

14 Claims, 2 Drawing Sheets

U.S. PATENT DOCUMENTS

2006/0025320 A1 * 2/2006 Borner et al. ............ 510/175

FOREIGN PATENT DOCUMENTS

| DE | 10051052 A1 | 4/2002 |
|---|---|---|
| GB | 822251 | 10/1959 |
| JP | 10046369 | 2/1998 |
| JP | 2002359248 | 2/2002 |
| WO | 2004027840 A2 | 4/2004 |
| WO | 2004027840 A3 | 4/2004 |

OTHER PUBLICATIONS

Park et al., Separation and Preconcentration Method for Palladium, Platinum and Gold from Some Heavy Metals Using Amberlite IRC 718 Chelating Resin, Bull. Korean Chem. Soc., 2000, p. 121-124, vol. 21, No. 1.

Wang et al., Controlling Wafer Contamination Using Automated On-Line Metrology durinng Wet Chemical Cleaning, Proceedings from the 2003 Characterization and Metrology for ULSI Technology Conference, 2003, 9 pgs.

* cited by examiner

SILICON WAFER ETCHING COMPOSITIONS

CROSS-REFERENCE TO RELATED APPLICATIONS

This application is a divisional of U.S. patent application Ser. No. 11/152,362, filed on Jun. 14, 2005, which published as U.S. Pub. No. 2006/0011588 on Jan. 19, 2006, now U.S. Pat. No. 7,323,421, which is incorporated in its entirety herein by reference. U.S. patent application Ser. No. 11/152,362 claims priority from U.S. provisional application Ser. No. 60/580,224, filed on Jun. 16, 2004, which is incorporated in its entirety herein by reference.

FIELD OF THE INVENTION

The present invention relates, in general, to a process for etching silicon wafers with a caustic etching solution and, in particular, to a caustic etching process providing wafers having a reduced concentration of metal impurities in the wafer bulk.

BACKGROUND OF THE INVENTION

Silicon wafers are typically obtained by a multi-step process, including: slicing a single crystal silicon ingot in a direction normal to the axis of the ingot to produce thin wafers; chamfering or profiling the edges of the wafers; grinding or lapping the wafers to remove surface damage caused by the slicing process; chemically etching the wafers to remove mechanical damage produced by the prior shaping steps; and finally, chemically/mechanically polishing the edge and at least one surface of each wafer with, for example, a colloidal silica slurry and a chemical etchant to ensure that the wafers have highly flat, reflective, and damage-free surfaces. The wafers are then typically cleaned and quality inspected prior to being packaged. Additional cleaning steps can be introduced between these steps as required.

Prior to chemical etching, silicon wafers typically exhibit surface and/or subsurface defects such as embedded particles and physical damage (e.g., micro-cracks, fractures, or stress-induced crystalline imperfections). The physical damage may be induced by stress applied to the wafer by processes such as lapping, grinding, and edge profiling. These defects generally occur in the region extending from the surface of the wafer to at least about 2.5 μm or greater below the surface of the wafer. To remove these defects, therefore, at least about 2.5 μm of silicon is typically removed from the surface of the wafer using an acidic and/or caustic chemical etchant, thus removing the embedded particles, contaminants, and physical damage contained in the removed layer of silicon.

Caustic etching offers certain advantages over acidic etching. Commercially available sources of sodium hydroxide, potassium hydroxide, and similar hydroxide etchants, however, typically contain a significant concentration of nickel, copper, and other metals capable of diffusing into the bulk of the silicon wafer during the etching process. To reduce the potential for contamination, therefore, Nakano et al., U.S. Pat. No. 6,110,839, pretreat the caustic etching solution with a chelating resin to reduce the metal ion concentration in the etchant before the etchant contacts the wafers in an etchant tank or equivalent apparatus; disadvantageously, however, this approach introduces an additional processing step and fails to address the problem of metallic impurities introduced into the caustic etching solution after the pretreatment (i.e., during the etching process itself).

SUMMARY OF THE INVENTION

Among the objects of the invention, therefore, is the provision of an improved caustic etchant for etching silicon wafers, and an improved caustic etching process for silicon wafers exhibiting lower levels of metal contamination as compared to wafers etched with conventional caustic etchants.

Briefly, therefore, the present invention is directed to an etching process for removing silicon from the surface of a silicon wafer. The process comprises etching the silicon wafer with a caustic etchant in an etching apparatus to reduce the wafer's overall thickness, as measured between the wafer's two generally parallel surfaces, by at least about 5.0 μm, i.e., about 2.5 μm from both the front and back surface. The caustic etchant comprises water, at least about 15% by weight of a hydroxide ion source, and a metal chelating agent to sequester metal ion impurities in the caustic etchant from the surface of the silicon wafer.

The present invention is further directed to a caustic etchant for etching silicon from the surface of a silicon wafer. The caustic etchant comprises water, at least about 40% by weight of a hydroxide ion source, and chelates formed between a chelating agent and metal ion impurities in the caustic etchant. The concentration of free metal ions in the caustic etchant is less than about 1 ppb and, the chelating agent is selected from the group consisting of ethylenediaminetetraacetic acid, diethylenetriaminepentacetic acid, glycolic acid, glycine (oxidase), dimethylgloxime, iminodisuccinic acid, nitrilotriacetic acid, and mixtures thereof.

Other objects and features of this invention will be in part apparent and in part pointed out hereinafter.

DETAILED DESCRIPTION OF THE EMBODIMENTS OF THE INVENTION

Figure 1:
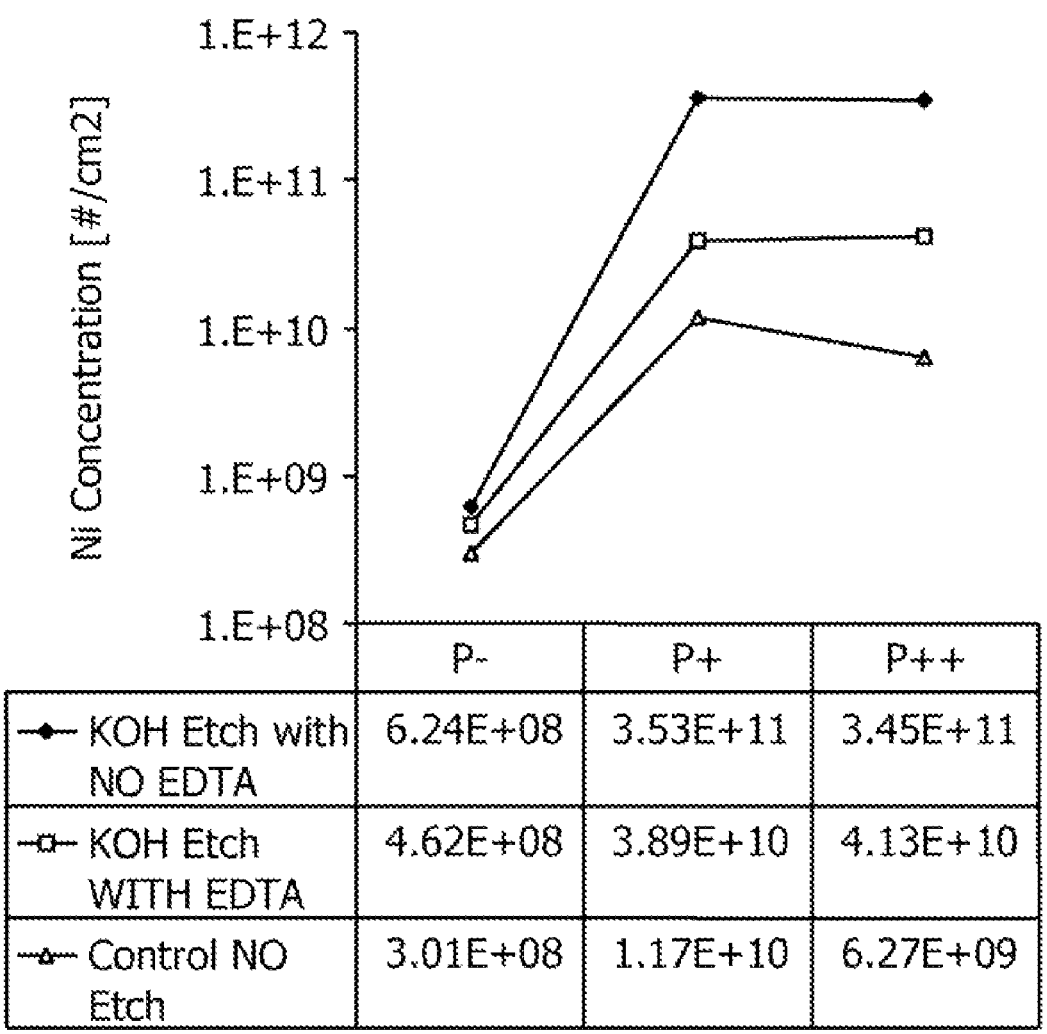
FIG. 1 is a graph of Ni ion concentration, comparing the bulk nickel concentration of wafers prepared according to Example 1.

In accordance with the present invention, it has been discovered that metal contamination of silicon wafers may be reduced during a caustic etching process by including a metal chelating agent in the etchant. The metal chelating agent advantageously sequesters copper, nickel, chromium, iron, and other such metals that may contaminate the etched wafer. For example, the chelating agent is especially effective at sequestering copper and nickel, which could otherwise potentially diffuse into the bulk of the silicon wafer during the etching process.

A caustic etchant of the present invention thus comprises one or more hydroxide ion source(s) such as sodium hydroxide, potassium hydroxide, lithium hydroxide, cesium hydroxide, ammonium hydroxide, or tetramethylammonium hydroxide. In a preferred embodiment, the caustic etchant comprises potassium hydroxide.

In general, a greater concentration of hydroxide ions tends to increase the rate of etching of the silicon. At a minimum, therefore, the etchant comprises at least 15% by weight of a hydroxide ion source(s). More typically, the etchant will comprise at least 40 wt %, still more typically at least about 45 wt %, and still more typically at least about 65 wt % of the hydroxide ion source(s).

To maximize silicon etch rates, the concentration of the hydroxide ion source is preferably near the saturation point. To minimize the formation of precipitates which may associate with the surface of the wafer and thereby potentially interfere with the etching process or adversely affect the nanotopography of the etched wafer, it is preferred that the concentration be maintained at a value less than the saturation value (at the etching temperature). Thus, for example, it is generally preferred that concentration of the hydroxide ion source be at least 70% but no more than 95% of the saturation concentration of the source of hydroxide ions. More preferably, the concentration of the hydroxide ion source is at least about 74% but no more than 95% of the saturation concentration. Still more preferably, at least about 77% but no more than 95% of the saturation concentration.

Generally, any chelating agent capable of complexing metal ions, such as copper and nickel, may be used in the etchant. Preferably, however, the chelating agent is a composition capable of forming several coordinate bonds with a single metal ion, such that the resulting chelates are relatively stable in the etching solution and may comprise one or more multidentate ligands (e.g., bidentate, tridentate, and hexadentate ligands). Preferred chelating agents include, for example, ethylenediaminetetraacetic acid (EDTA), diethylenetriaminepentacetic acid, glycolic acid (available as GLOXYME from Bayer Chemical), glycine (oxidase) (available from Bayer Chemical), dimethylgloxime, nitrilotriacetic acid, and iminodisuccinic acid (available as BAYPURE from Bayer Chemical). In an especially preferred embodiment, the chelating agent is EDTA. Advantageously, EDTA is versatile in that it can form up to six bonds with a metal ion and is able to readily form chelates or complexes with both transition-metal ions and main-group metal ions.

To reduce the risk that the silicon wafers will be contaminated by metal ions carried by the hydroxide ion source, it is generally preferred that the etchant be formed by combining sufficient chelating agent with the hydroxide ion source and water to reduce the free metal ion concentration in the etchant to a value of less than about 1 ppb. More preferably, the free metal ion concentration in the fresh etchant, i.e., before it is brought into contact with a silicon wafer is less than about 0.5 ppb. Even more preferably, the free metal ion concentration in the fresh etchant is less than about 0.05 ppb. The remainder of the free metal ions originally carried by the hydroxide ion source (or even the water used to form the etchant) will be present in the etchant as a metal chelate and thus have substantially less potential to contaminate the silicon wafer during the etching process.

Hydroxide ion sources are not the only sources of metal ions during silicon wafer etching processes. Other sources include, for example, the etching apparatus (e.g., the tank, pump, thermocouple, wafer cassettes, or other components of or used in the etching apparatus) and even the surfaces of the silicon wafers themselves. In general, therefore, it is preferred that the etchant, at least initially, contain free chelating agent. That is, it is generally preferred that the etchant contain more chelating agent than is required to complex the metal ion impurities introduced solely by the hydroxide source. This approach enables the free metal ion concentration to be maintained at relatively low levels, particularly when metal ion contaminants are contributed to the etchant (either prior or subsequent to the initiation of etching) by sources other than the hydroxide ion source. For example, the concentration of free chelating agent in the caustic etchant is preferably at least about 100 ppm, more preferably at least about 200 ppm, even more preferably at least about 350 ppm, and still more preferably at least about 500 ppm. Expressed otherwise, the molar ratio of chelating agent added to the etching solution relative to the concentration of metal ion impurities introduced from the source of hydroxide ions is preferably at least about 5:1, more preferably, at least about 10:1, and still more preferably at least about 100:1.

In addition to water, a source of hydroxyl ions, and a chelating agent, the caustic etchant may additionally comprise a range of additives. For example, the etchant may comprise a salt additive such as potassium fluoride or potassium carbonate, which contributes to improved surface characteristics; see, e.g., PCT application No. WO 2004/027840 A2, published Apr. 1, 2004.

The caustic etchant may be prepared in the etching apparatus itself (prior to the introduction of the wafers) or the etchant can be preformed by combining the components thereof before introduction to the etching apparatus. For example, silicon wafers are typically etched by being immersed in a tank holding a volume of the etchant. Thus, the components of the caustic etchant may be combined in the etchant tank before the wafers are introduced, or the components may be combined outside the tank, and the resulting mixture is then introduced to the tank. Although less preferred, the silicon wafers and caustic etchant (lacking a chelating agent) may alternatively be combined in the etching tank before the chelating agent is introduced.

Silicon wafers to be etched in accordance with the process of the present invention may be prepared by any means generally known in the art. Typically, these wafers contain surface and/or subsurface defects as a result of certain previous processing steps with the defects extending from the surface of the wafer to a depth of at least about 2.5 μm from the surface of the wafer.

The silicon wafer is introduced to an etching apparatus where the wafer is contacted with the caustic etchant. Contact may occur by spraying the etchant onto the wafer, spin etching, or, more preferably, by immersing the silicon wafer(s) (individually or simultaneously in a carrier) in a body of etchant. Suitable immersion etchers include those commercially available from SPEC (Valencia, Calif.), Toho (Japan), and Dan Science (Japan).

In general, the caustic etchant is typically maintained at a temperature of about 70° C. to 120° C. Within this range, the temperature will more typically be at least about 75° C. and, still more typically, at least about 80° C. For example, in one embodiment, the temperature of the etchant is typically maintained between about 75° C. and about 90° C., or even about 75° C. to about 85° C. When the caustic etching solution comprises a salt additive as described above, higher temperatures within the ranges set forth above (e.g., temperatures from about 100° C. to about 120° C.) may be utilized to promote dissolution of the salt additive in the caustic etchant.

The wafer is etched until the desired amount of material removal is achieved. Typically, the wafer is etched to remove a layer of silicon from the wafer's surface having a thickness of at least about 2.5 μm. This reduces the wafer's overall thickness by at least about 5.0 μm as measured between the wafer's two generally parallel surfaces. More typically, the wafer is etched to remove a layer of silicon from the wafer's surface having a thickness of at least about 5.0 μm. For example, etching may proceed for a time sufficient to remove a layer of silicon from the wafer's surface having a thickness of between about 5.0 μm to about 15 μm, more typically from about 7.5 μm to about 12.5 μm, and still more typically from about 8.5 μm to about 11.5 μm. To achieve this amount of material removal, and depending upon the temperature of the etchant, the wafer will typically be contacted with the etchant for at least 5 minutes. Typically, the surface of the wafer remains in contact with the caustic etchant for about 5 minutes to about 15 minutes, preferably for about 9 minutes to about 11 minutes, and, more preferably, for about 10 minutes to about 10.5 minutes.

In a preferred embodiment, a volume of etchant is used, or reused, to etch a series of silicon wafers or cassettes of silicon wafers until the silicate concentration in the etchant becomes undesirably high. Until then, the etchant may periodically receive additional amounts of water, hydroxide ion source, chelating agent, or other components of the etchant to replace any such depleted component which evaporates, is consumed by the etching process, is carried out of the etching apparatus by the wafers or carriers for the wafers, or is otherwise removed. For example, as the etching process proceeds, additional chelating agent may be added to the etching tank as necessary to sequester metal ion impurities generated in situ or carried in by the etchant so that the concentration of free metal ion impurities in the caustic etching solution contacting the silicon wafer(s) is maintained at a value of less than about 100 ppb by weight, more preferably less than about 50 ppb by weight, and even more preferably less than about 25 ppb by weight.

The concentration of free chelating agent or metal ion concentration in the etchant may be monitored by means commonly known in the art. For example, in one embodiment, free chelating agent concentration is monitored by titrating an amount of the caustic etching solution from the etching tank and introducing it to a fixed amount of calcium carbonate that contains calcium ions in excess of the amount that could be complexed by the maximum concentration of chelating agent. An indicator can be used to measure the amount of calcium ions originally present. One such indicator is calcon or solochrome dark blue (eriochrome blue black R, sodium 1-(2-hydroxy-1-naphthylazo)-2-naphthol-4-sulphonate). (Available from Mallinckrodt Baker, catalog number, 2538-85-4). Once combined, the free chelating agent from the etching solution complexes some amount of calcium ions. At this point, the indicator is used to measure the calcium ion level, thereby giving the total amount of calcium ions that were complexed by the chelating agent of the etching solution, which is then used to determine the amount of chelating agent present in the etching solution. If the level of chelating agent is insufficient, additional chelating agent can be introduced to return the concentration thereof to an appropriate level. Further, the measurement of the concentration can take place at a regular interval, ensuring adequate chelating agent concentration is maintained throughout the etching process. In one embodiment, the concentration of chelating agent is monitored about once every day.

A wafer etched in accordance with the present invention is typically removed from the etchant and cleaned before subsequent processing. After etching, the wafer is typically subjected to several processing steps involving polishing and cleaning to prepare the surface to a condition acceptable for semiconductor device manufacturers.

The present invention is illustrated by the following examples, which are merely for the purpose of illustration and not to be regarded as limiting the scope of the invention or manner in which it may be practiced.

EXAMPLE 1

A caustic etching solution was formed by combining water and KOH in ratios to form 45 wt % KOH solution. A typical etching bath quantity of 120 liters of this solution was formed. The KOH source was electronic grade, reporting a maximum impurity level of 1 ppm by weight of metal impurities. For 120 liters of solution, this corresponds to 0.003 moles of metal ion impurities. Twenty-five (25) wafers were immersed in the caustic etching solution. The wafers were an assortment of P−, P+, and P++ doped wafers. The silicon wafers were contacted with the caustic etching solution for 10 minutes while the solution was maintained at 80° C., removing about 20 μm of total stock from the front and back of the wafers.

After etching with the standard, untreated caustic etchant, the etching solution was modified according to this invention by adding 0.2 moles of EDTA (approximately 65 g) directly to the caustic etchant. This amount equates to over sixty-six times the amount of EDTA needed to chelate the 0.003 moles of metal ions from the KOH source. Twenty five (25) silicon wafers of assorted doping were then introduced to this caustic etching solution in the etching tank. The silicon wafers were contacted with the caustic etching solution for 10 minutes while the solution was maintained at 80° C., removing about 20 μm of total stock from the front and back of the wafers.

After each etching process, the wafers were thoroughly rinsed with a rinsing solution comprising approximately 0.1 M hydrochloric acid to remove any surface metals from the wafers. Subsequent cleaning in SC1 followed by a hydrofluoric cleaning solution further reduced surface metal values to a level of approximately $1 \times 10^{10}/cm^2$ or lower. Next, the wafers were heat treated at 350° C. for 3 hours to bring nickel atoms from the interior to the wafer to the wafer's surface. The wafers were then treated with a solution of hydrofluoric acid and hydrogen peroxide to extract surface metals from the wafers. This extraction solution was prepared by combining 10 mL of 49% HF and 20 mL of 31% $H_2O_2$ with 70 mL of deionized water. The extracted substance was analyzed using Inductively Couples Plasma Mass Spectrometry (ICPMS) to determine the metal concentration therein. The results of this analysis are shown in FIG. 1. As seen there, the nickel values in the P+ and P++ wafers were reduced approximately 90% in the samples processed with the EDTA-modified caustic etchant compared to the standard, untreated etching solution.

EXAMPLE 2

To examine the affect of EDTA on a fully processed wafer's concentration of metal ion impurities, silicon wafers were fully processed using a caustic etching solution. Four (4) of these wafers were processed using a standard, untreated etching solution as detailed in Example 1, while four (4) were processed using a modified etching solution according to the modified caustic etchant detailed in Example 1. For additional comparison, four (4) silicon wafers were fully processed using an acidic etching solution. Each of these groups had two (2) P− wafers and two (2) P++ wafers. For this example, a "fully processed" wafer is one that has been subjected to grinding or lapping, chemical etching, chemical/mechanical polishing, and polished wafer cleaning.

The first group of silicon wafers to be etched with a standard, unmodified caustic etchant were contacted with the KOH solution described in Example 1 for 10 minutes while the solution was maintained at 80° C., removing about 20 μm of total stock from the front and back of the wafers.

The second group of silicon wafers to be etched with a chelating agent-modified caustic etchant were contacted with the EDTA-modified KOH solution described in Example 1 for 10 minutes while the solution was maintained at 80° C., removing about 20 μm of total stock from the front and back of the wafers.

The third group of silicon wafers to be etched with an acidic etchant formed according to U.S. Pat. No. 5,340,437. These wafers were contacted with the acidic etching solution for about 2 minutes while the solution was maintained at about 37° C., removing about 20 μm of total stock from the front and back of the wafers.

Figure 2:
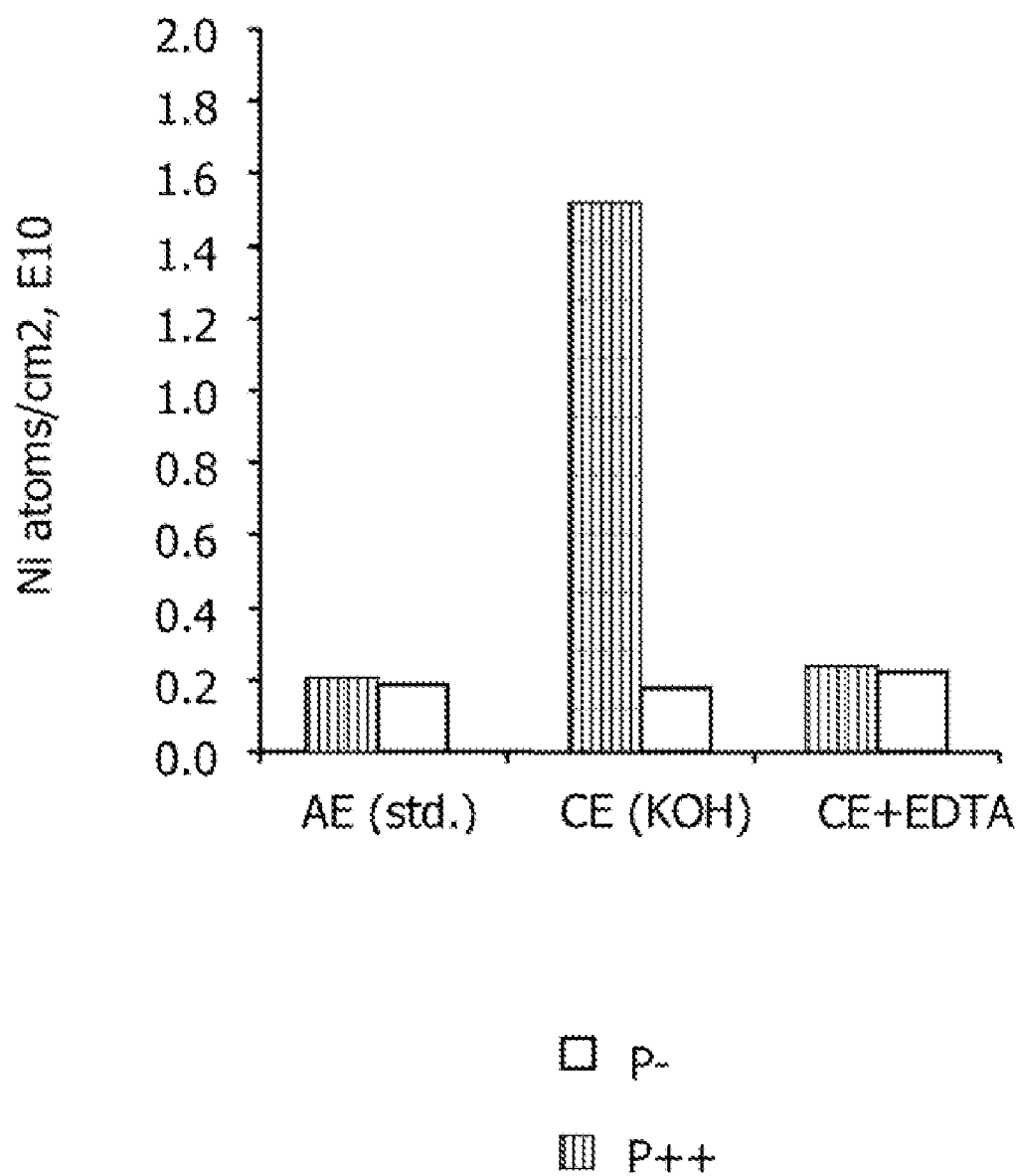
FIG. 2 is a graph of Ni ion concentration, comparing the nickel out-diffusion concentration of wafers prepared according to Example 2.

After each etching process, the wafers were subjected to standard polishing and cleaning procedures. For the cleaning procedures, all the wafers were thoroughly rinsed through SC1 and SC2-type cleaning processes to remove any surface metals from the wafers. Next, the wafers were heat treated at 350° C. for 3 hours to outdiffuse nickel ions. The wafers were then treated with a solution of hydrofluoric acid and hydrogen peroxide as disclosed in Example 1 to extract surface metals from the wafers. The extracted substance was analyzed using ICPMS to determine the metal concentration therein. The results of this analysis are shown in FIG. 2. As seen there, the wafers that were etched with the EDTA-modified caustic etchant (CE+EDTA) had nickel values in both the P++ wafers and P− wafers similar to the P++ wafers and P− wafers etched with the acidic etching solution (AE(std.)), and with nickel values in the P++ wafers well below those etched in the unmodified caustic etching solution (CE(KOH)).

The present invention is not limited to the above embodiments and can be variously modified. The above description of preferred embodiments is intended only to acquaint others skilled in the art with the invention, its principles and its practical application so that others skilled in the art may adapt and apply the invention in its numerous forms, as may be best suited to the requirements of a particular use.

With reference to the use of the word(s) "comprise" or "comprises" or "comprising" in this entire specification (including the claims below), it is noted that unless the context requires otherwise, those words are used on the basis and clear understanding that they are to be interpreted inclusively, rather than exclusively, and that it is intended each of those words to be so interpreted in construing this entire specification.

What is claimed is:

1. A caustic etchant for etching silicon from the surface of a silicon wafer, the caustic etchant comprising water, at least about 65% by weight of a hydroxide ion source, and chelates formed between a chelating agent and metal ion impurities in the caustic etchant wherein the concentration of free metal ions in the caustic etchant is less than about 1 ppb and, wherein the chelating agent is selected from the group consisting of ethylenediaminetetraacetic acid, diethylenetriaminepentacetic acid, glycolic acid, glycine (oxidase), dimethylgloxime, iminodisuccinic acid, nitrilotriacetic acid, and mixtures thereof.

2. The caustic etchant of claim 1 wherein the chelating agent is ethylenediaminetetraacetic acid.

3. The caustic etchant of claim 1 wherein the caustic etchant further comprises at least about 100 ppm by weight of free chelating agent.

4. The caustic etchant of claim 1 wherein the caustic etchant further comprises at least about 200 ppm by weight of free chelating agent.

5. The caustic etchant of claim 1 wherein the caustic etchant further comprises at least about 350 ppm by weight of free chelating agent.

6. The caustic etchant of claim 1 wherein the caustic etchant further comprises at least about 500 ppm by weight of free chelating agent.

7. The caustic etchant of claim 1 wherein substantially all of the metal ion impurities in the caustic etchant are sequestered in chelates.

8. The caustic etchant of claim 1 wherein the molar ratio of chelating agent combined with the hydroxide ion source to metal ion impurities in the hydroxide ion source is at least about 5:1.

9. The caustic etchant of claim 1 wherein the molar ratio of chelating agent combined with the hydroxide ion source to metal ion impurities in the hydroxide ion source is at least about 10:1.

10. The caustic etchant of claim 1 wherein the concentration of free metal ions is less than about 0.5 ppb.

11. The caustic etchant of claim 1 wherein the concentration of free metal ions is less than about 0.05 ppb.

12. The caustic etchant of claim 1 further comprising a salt selected from the group consisting of potassium fluoride, potassium carbonate, and a combination thereof.

13. The caustic etchant of claim 1 wherein the hydroxide ion source is selected from the group consisting of potassium hydroxide, ammonium hydroxide, tetramethylammonium hydroxide, sodium hydroxide, lithium hydroxide, cesium hydroxide, and mixtures thereof.

14. The caustic etchant of claim 13 wherein the hydroxide ion source is potassium hydroxide.

\* \* \* \* \*